United States Patent
Tazbaz et al.

(10) Patent No.: US 11,783,978 B2
(45) Date of Patent: Oct. 10, 2023

(54) ADJUSTABLE CLOSURE MAGNET FOR HINGED DEVICE WITH ASSISTED OPEN

(71) Applicant: Microsoft Technology Licensing, LLC, Redmond, WA (US)

(72) Inventors: Errol Mark Tazbaz, Bellevue, WA (US); Nishant Srinivasan, Johns Creek, GA (US); Karsten Aagaard, Monroe, WA (US); Angela Chen Krauskopf, Sammamish, WA (US); David Otto Whitt, III, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1496 days.

(21) Appl. No.: 16/029,477

(22) Filed: Jul. 6, 2018

(65) Prior Publication Data
US 2020/0013531 A1 Jan. 9, 2020

(51) Int. Cl.
*G06F 1/16* (2006.01)
*H01F 7/02* (2006.01)
(Continued)

(52) U.S. Cl.
CPC ....... *H01F 7/0263* (2013.01); *E05B 47/0038* (2013.01); *E05B 63/0056* (2013.01);
(Continued)

(58) Field of Classification Search
CPC .... G06F 1/1615; G06F 1/1616; G06F 1/1618; G06F 1/1679
See application file for complete search history.

(56) References Cited

U.S. PATENT DOCUMENTS

| | | | |
|---|---|---|---|
| 6,366,440 B1* | 4/2002 | Kung | E05C 19/16 361/679.55 |
| 6,929,291 B2* | 8/2005 | Chen | G06F 1/1679 361/732 |

(Continued)

FOREIGN PATENT DOCUMENTS

| | | |
|---|---|---|
| CN | 104665174 A | 6/2015 |
| EP | 1429041 A1 | 6/2004 |
| EP | 2362611 B1 | 12/2013 |

OTHER PUBLICATIONS

"International Search Report and Written Opinion Issued in PCT Application No. PCT/US2019/037849", dated Sep. 20, 2019, 13 Pages.

(Continued)

*Primary Examiner* — Anthony Q Edwards
(74) *Attorney, Agent, or Firm* — RAY QUINNEY & NEBEKER P.C.; Paul N. Taylor (57) ABSTRACT

A closure device includes a first magnet and a housing with a second magnet positioned therein. The first magnet is configured to be position in a first object and the housing is configured to be positioned in a second object. The housing has a top end and at least one adjustment mechanism connected to the housing that moves the second magnet in at least one translational direction or at least one rotational direction relative to the top end of the housing. The movement of the second magnet relative to the top end of the housing adjusts the position or orientation of the second magnet relative to the first magnet to alter a magnetic force between the first magnet and the second magnet when the first magnet is positioned proximate the top end of the housing.

19 Claims, 6 Drawing Sheets

(51) Int. Cl.
*E05B 47/00* (2006.01)
*E05B 63/00* (2006.01)
*E05B 65/00* (2006.01)
*E05F 1/12* (2006.01)
*H05K 5/02* (2006.01)

(52) U.S. Cl.
CPC ............ *E05B 65/0067* (2013.01); *E05F 1/12* (2013.01); *H05K 5/0221* (2013.01); *H05K 5/0226* (2013.01); *E05Y 2900/606* (2013.01)

(56) References Cited

U.S. PATENT DOCUMENTS

| | | | |
|---|---|---|---|
| 7,363,065 B2 | 4/2008 | Lee | |
| 7,486,165 B2* | 2/2009 | Ligtenberg | G06F 1/1616 335/205 |
| 7,661,732 B2* | 2/2010 | Hsu | H04M 1/0245 292/251.5 |
| 8,353,083 B2 | 1/2013 | Wu et al. | |
| 8,801,054 B2 | 8/2014 | Ligtenberg et al. | |
| 8,925,152 B2 | 1/2015 | Ejima | |
| 9,047,055 B2 | 6/2015 | Song | |
| 9,152,183 B2 | 10/2015 | Kurczewski | |
| 9,840,861 B1 | 12/2017 | Maatta | |
| 2002/0133907 A1* | 9/2002 | Oshima | F16C 11/10 16/321 |
| 2007/0133156 A1* | 6/2007 | Ligtenberg | G06F 1/1616 361/679.3 |
| 2008/0186683 A1* | 8/2008 | Ligtenberg | G06F 1/1616 335/207 |
| 2009/0103261 A1* | 4/2009 | Shih | H05K 5/0221 361/728 |
| 2009/0289063 A1* | 11/2009 | Fullerton | H01M 50/204 220/230 |
| 2013/0286551 A1* | 10/2013 | Ashcraft | G06F 1/1679 361/679.01 |
| 2015/0237748 A1 | 8/2015 | Andre et al. | |
| 2018/0054905 A1* | 2/2018 | Määttä | H01F 7/0263 |
| 2018/0075957 A1* | 3/2018 | Määttä | G06F 1/16 |
| 2019/0164675 A1* | 5/2019 | Srinivasan | E05C 19/16 |
| 2021/0325937 A1* | 10/2021 | Siddiqui | G06F 1/1683 |
| 2022/0159170 A1* | 5/2022 | Platner | H04M 1/0245 |

OTHER PUBLICATIONS

"Notice of Allowance Issued in European Patent Application No. 19742504.4", dated Jul. 3, 2023, 8 Pages.

* cited by examiner

ADJUSTABLE CLOSURE MAGNET FOR HINGED DEVICE WITH ASSISTED OPEN

BACKGROUND

Background and Relevant Art

Portable electronic devices can use a hinged design to protect screens or input interfaces by closing the electronic device during travel. Holding the electronic device in the closed position securely during travel while allowing simple and convenient opening of the device can be competing design interests. Many secure latches are difficult to open, particularly with one hand on small electronic devices. Closure devices that allow for ease of opening and simple operation can risk unintended opening and damage of the device.

An electronic device with a biased or assisted hinge can ease opening of the electronic device once a closure device is overcome. A magnetic closure device can provide the closure force to hold the device in the closed state, but manufacturing variations produce a large range of closure device performance.

BRIEF SUMMARY

In some implementations, a closure device includes a first magnet and a housing with a second magnet positioned therein. The first magnet is configured to be position in a first object and the housing is configured to be positioned in a second object. The housing has a top end and at least one adjustment mechanism connected to the housing that moves the second magnet in at least one translational direction or at least one rotational direction relative to the top end of the housing. The movement of the second magnet relative to the top end of the housing adjusts the position or orientation of the second magnet relative to the first magnet to alter a magnetic force between the first magnet and the second magnet when the first magnet is positioned proximate the top end of the housing.

In some implementations, an electronic device includes a first portion and a second portion that is movably connected to the first portion by a hinge. The hinge has a closed position and an open position. An open biasing element biases the hinge toward the open position, and a closure device biases the hinge toward the closed position. The closure device includes a first magnet positioned in the first portion of the electronic device and a housing with a second magnet positioned therein where the housing is positioned in the second portion of the electronic device. The housing has a top end and at least one adjustment mechanism connected to the housing that moves the second magnet in at least one translational direction or at least one rotational direction relative to the top end of the housing. The movement of the second magnet relative to the top end of the housing adjusts the position or orientation of the second magnet relative to the first magnet to alter a magnetic force between the first magnet and the second magnet when the first magnet is positioned proximate the top end of the housing.

In some implementations, a method of manufacturing a hinged device with a closure mechanism includes measuring a z-direction net force in a z-direction applied to a hinge of an electronic device from a closed position toward an open position with a hinge axis of the hinge oriented in a x-direction orthogonal to the z-direction where the z-direction is a direction of gravity, measuring a x-direction net force in the x-direction applied to the hinge of the electronic device from the closed position toward the open position with the hinge axis of the hinge oriented in the z-direction orthogonal to the x-direction, measuring a y-direction net force in a y-direction applied to the hinge of the electronic device from the closed position toward the open position with the hinge axis of the hinge oriented in the x-direction orthogonal to the y-direction, and adjusting an x-position, a y-position, or a z-position of a magnet of the closure device based on the measured x-direction net force, the measured y-direction net force, or the z-direction net force.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific implementations thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example implementations, the implementations will be described and explained with additional specificity and detail through the use of the accompanying drawings in which:

FIG. 2-1 is a side cross-sectional view of a closure device, according to at least one implementation of the present disclosure;

FIG. 2-2 is a top cross-sectional view of the closure device of FIG. 2-1;

FIG. 3-1 is a side cross-sectional view of another closure device, according to at least one implementation of the present disclosure;

FIG. 3-2 is a top cross-sectional view of the closure device of FIG. 3-1;

FIG. 4-1 is a side cross-sectional view of yet another closure device, according to at least one implementation of the present disclosure;

FIG. 4-2 is a top cross-sectional view of the closure device of FIG. 4-1;

FIG. 5-1 is a side cross-sectional view of a further closure device, according to at least one implementation of the present disclosure;

FIG. 5-2 is a top cross-sectional view of the closure device of FIG. 5-1;

FIG. 6-1 is a schematic representation of magnetic forces between magnets with aligned opposite poles;

FIG. 6-2 is a schematic representation of attraction forces between the magnets of FIG. 6-1 with misaligned opposite poles;

FIG. 7-1 is a side cross-sectional view of a yet further closure device, according to at least one implementation of the present disclosure;

FIG. 7-2 is a top view of the closure device of FIG. 7-1;

FIG. 8-1 is a schematic representation of magnetic forces between magnets with rotationally aligned opposite poles;

FIG. 8-2 is a schematic representation of attraction forces between the magnets of FIG. 8-1 with rotationally misaligned opposite poles;

FIG. 8-3 is a schematic representation of attraction forces between the magnets of FIG. 8-1 with rotationally aligned identical poles;

DETAILED DESCRIPTION

This disclosure generally relates to devices, systems, and methods for controlling the closure and opening of a hinged device. More particularly, the present disclosure relates to devices, systems, and methods for adjusting a closure force created by a closure device in a hinged electronic device. In some implementations, an electronic device has a first portion and second portion connected by a hinge, such as a laptop. The hinge of the electronic device may have a spring, a magnet, or other biasing element to bias the electronic device open in order to aid with the opening of the electronic device. A closure device according to the present disclosure may apply a magnetic closure force to hold the electronic device in a closed position. One or more adjustment mechanisms may allow a position of one or more magnets of the closure device to be adjusted. Thereby, a magnitude of the closure force in the closed position may be adjusted.

Figure 1:
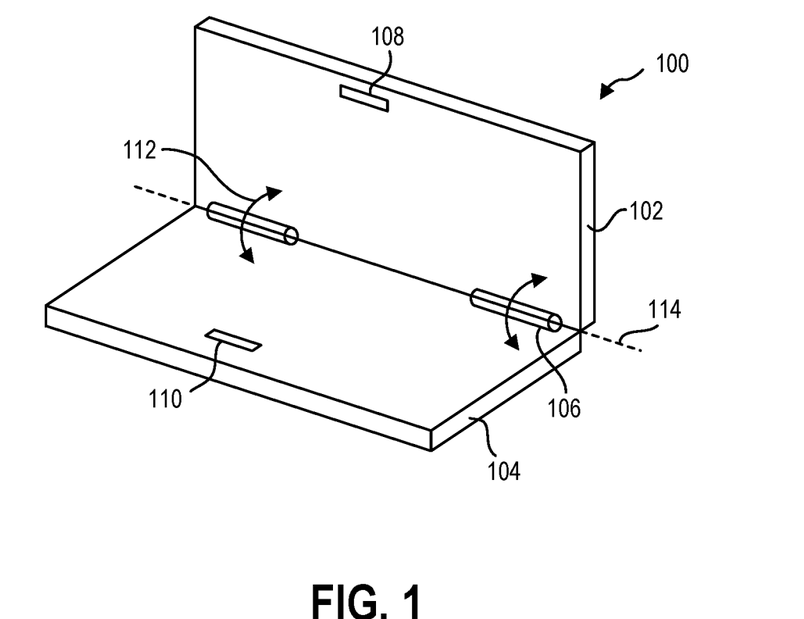
FIG. 1 is a perspective view of a hinged electronic device, according to at least one implementation of the present disclosure.

FIG. 1 is a perspective view of an electronic device 100 according to at least one implementation of the present disclosure. The electronic device 100 includes a first portion 102 and a second portion 104 that are movably connected around a hinge 106. The hinge 106 may include an open biasing element, such as a spring, a magnet, a bushing, a piston-and-cylinder, or other compressible or resilient member that provides an open biasing force 112 that biases the hinge 106, and therefore the electronic device 100, toward an open position. The hinge 106 may apply an open biasing force 112 to move the first portion 102 and second portion 104 apart from one another around the hinge axis 114.

The electronic device 100 includes a closure device that generates an attraction force when the electronic device 100 is in a closed position. The closure device includes a first closure portion 108 and a second closure portion 110. The first portion 102 of the electronic device 100 includes the first closure portion 108 and the second portion 104 includes the second closure portion 110.

The closure device may provide a close biasing force that is greater than the open biasing force when the electronic device is in the closed position. The close biasing force may decrease as the first closure portion 108 and a second closure portion 110 move apart as the electronic device 100 opens. While the close biasing force is greater than the open biasing force when the electronic device is in the closed position, the open biasing force may be equal to or greater than the close biasing force when the electronic device 100 is more than 5° open. For example, the electronic device may be 5° open when the first portion 102 and second portion 104 form a 5° angle at the hinge 106. In other implementations, the open biasing force may be equal to or greater than the close biasing force when the electronic device 100 is more than 10° open. In yet other implementations, the open biasing force may be equal to or greater than the close biasing force when the electronic device 100 is more than 15° open.

Figure 21:
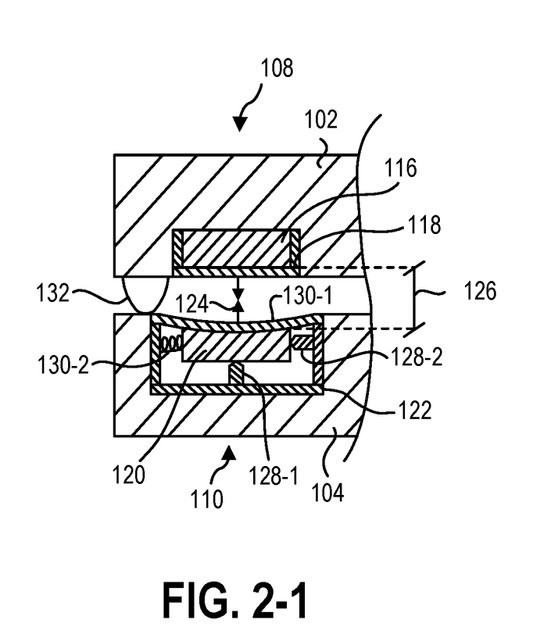

FIG. 2-1 is a cross-sectional side view of the closure device of the electronic device 100 of FIG. 1, in a closed position. The closure device includes the first closure portion 108 in the first portion 102 and the second closure portion 110 in the second portion 104. The first closure portion 108 includes a first magnet 116. In some implementations, the first magnet 116 may be fixed relative to the first portion 102 by a cover 118. In other implementations, the first magnet 116 may be positioned in the first portion without a cover 118, such that the first magnet 116 is visible at a surface of the first portion 102. The second closure portion 110 includes a second magnet 120 that is adjustable in position and/or orientation relative to the first closure portion 108 and first magnet 116.

The second magnet 120 is adjustable by one or more adjustment mechanisms (or adjustment mechanism means) that translate and/or rotate the second magnet 120 relative to the housing 122, such that a magnetic force 124 between the first magnet 116 and second magnet 120 is changed. In some implementations, the adjustment mechanisms may allow the magnetic force 124 to be increased or decreased. For example, the magnetic force 124 is related to a gap 126 between the first magnet 116 and the second magnet 120. In some implementations, the adjustment mechanisms include a first adjustment mechanism 128-1 that adjusts the gap 126.

In some implementations, the gap 126 may be in a range having an upper value, a lower value, or upper and lower values including any of 0 mm (i.e., the first magnet 116 and second magnet 120 in contact), 0.25 mm, 0.50 mm, 0.75 mm, 1.0 mm, 1.25 mm, 1.50 mm, 1.75 mm, 2.0 mm, 2.25 mm, 2.5 mm, 2.75 mm, or any values therebetween. For example, the gap 126 may be less than 2.75 mm. In other examples, the gap may be greater than 0.25 mm. In yet other examples, the gap 126 may be between 1.0 mm and 2.5 mm. In further examples, the gap 126 may be less than 2.5 mm. In at least one example, the gap 126 be less than 2.25 mm.

The first adjustment mechanism 128-1 may be positioned opposite a first spring 130-1 on an opposite side of the second magnet 120. The first spring 130-1 may be a leaf spring that covers the second magnet 120 and provides a cover to the second magnet 120 over the housing 122. The first adjustment mechanism 128-1 may be a screw with a threaded surface that interacts with the housing 122 and/or the second portion 104 of the electronic device to move the second magnet 120, and deform the first spring 130-1, in a first direction.

The one or more adjustment mechanisms may further include a second adjustment mechanism 128-2 positioned orthogonally to the first adjustment mechanism 128-1. The second adjustment mechanism 128-2 may alter the magnetic force 124 between the first magnet 116 and second magnet 120 by altering the alignment of the magnetic fields of the first magnet 116 and second magnet 120. The second adjustment mechanism 128-2 may be positioned opposite a second spring 130-2 on an opposite side of the second magnet 120. The second spring 130-2 may be a coil spring that applies a force to the second magnet 120 in a second direction. The second adjustment mechanism 128-2 may be a screw with a threaded surface that interacts with the housing 122 and/or the second portion 104 of the electronic device to move the second magnet 120, and deform the second spring 130-2, in the second direction.

Movement of the second magnet 120 relative to the housing 122 may change the gap 126 between the first magnet 116 and the second magnet 120. Other components, geometries, or structures of the first portion 102 and second portion 104 may additionally alter the gap 126. For example, the first portion 102 may include a spacer 132 or other structure positioned between the first portion 102 and second portion 104 to facilitate a user manually opening the electronic device. A spacer 132 or similar structure may further affect the gap 126 and, hence, the magnetic force 124. While the gap 126 affects the magnetic force 124, the alignment of the second magnet 120 with the first magnet 116 in the plane normal to the gap 126 (i.e., normal to the first direction) affects the magnetic force 124, as well.

Figure 22:
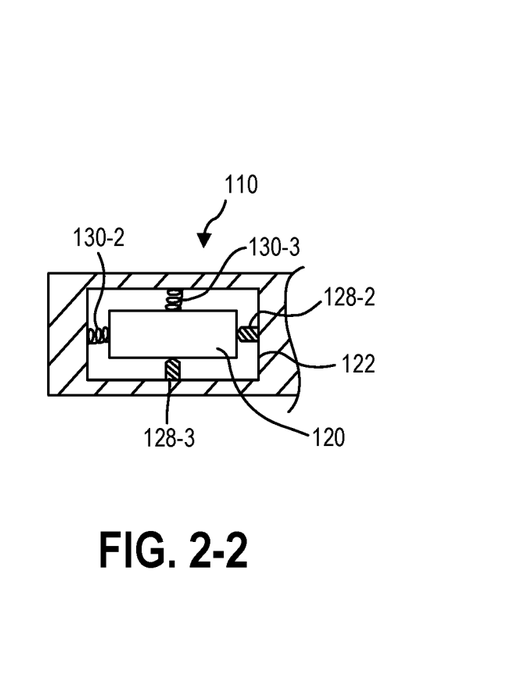

FIG. 2-2 is top view of the second closure portion 110 of FIG. 2-1. As described in relation to FIG. 2-1, the second magnet 120 is movable in the second direction by the second adjustment mechanism 128-2 and the second spring 130-2. The second magnet 120 is movable in a third direction orthogonal to the second direction by a third adjustment mechanism 128-3 positioned opposite a third spring 130-3 on an opposite side of the second magnet 120. The third spring 130-3 may be a coil spring that applies a force to the second magnet 120 in the third direction. The third adjustment mechanism 128-3 may be a screw with a threaded surface that interacts with the housing 122 and/or the second portion of the electronic device to move the second magnet 120, and deform the third spring 130-3, in the third direction.

In some implementations, an adjustment mechanism (such as the first adjustment mechanism 128-1, second adjustment mechanism 128-2, or third adjustment mechanism 128-3) may have a range of motion having an upper value a lower value, or upper and lower values including any of 0.25 mm, 0.50 mm, 0.75 mm, 1.0 mm, 1.25 mm, 1.50 mm, 1.75 mm, 2.0 mm, 2.25 mm, 2.5 mm, or any values therebetween. For example, the range of motion of the adjustment mechanism may be less than 2.5 mm. In other examples, the range of motion may be greater than 0.25 mm. In yet other examples, the range of motion may be between 0.5 mm and 2.0 mm. In further examples, the range of motion may be less than 2.0 mm. In at least one example, the range of motion be less than 1.5 mm.

Figure 31:
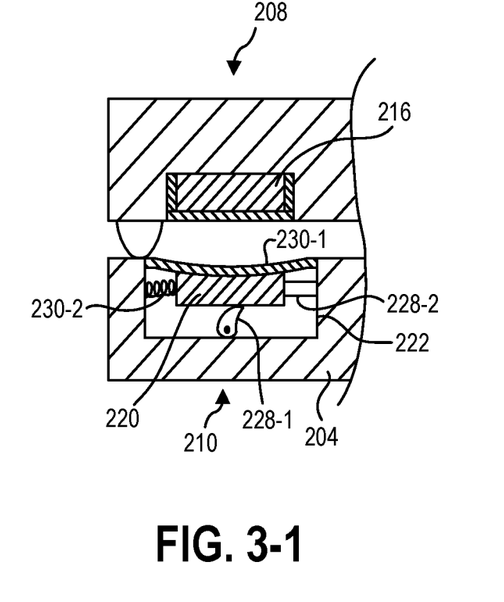
Figure 32:
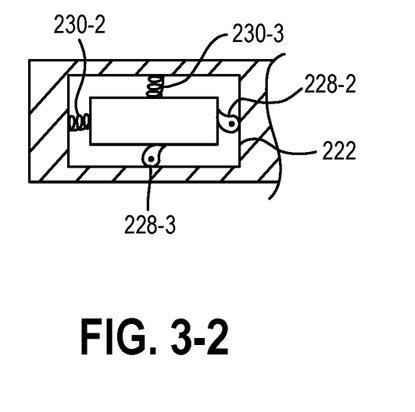

In other implementations, other types of adjustment mechanisms may apply a force to the second magnet to move the second magnet in the first direction, second direction, third direction, or any combination thereof to change the magnetic force. FIGS. 3-1 and 3-2 illustrate another implementation of closure device, according to the present disclosure. The first closure portion 208 includes a first magnet 216 and the second closure portion 210 includes a second magnet 220. The second magnet 220 is movable by a plurality of adjustment mechanisms relative to a housing 222 of the second magnet 220. While the housing 122 described in relation to FIG. 2-1 is a discrete part of the second closure portion 110, in other implementation, such as shown in FIG. 3-1, the housing 222 may be integral to the second portion 204 of the electronic device without a discrete part.

In some implementations, the first adjustment mechanism 228-1 is a rotatable cam that, when rotated, displaces the second magnet 220 in the first direction against a resilient member such as the first spring 230-1. The movement of the second magnet 220 in the first direction toward the first spring 230-1 moves the second magnet 220 toward the first magnet 216. A second adjustment mechanism 228-2 may be a rotatable cam that, when rotated, displaces the second magnet 220 in the second direction against a resilient member such as the second spring 230-2. The movement of the second magnet 220 in the second direction toward the second spring 230-2 changes the alignment of the second magnet 220 with the first magnet 216.

Similarly, FIG. 3-2 illustrates a third adjustment mechanism 228-3 positioned orthogonal to the second adjustment mechanism 228-2 and the first adjustment mechanism (not visible in FIG. 3-2). The third adjustment mechanism 228-3 may be a rotatable cam that, when rotated, displaces the second magnet 220 in the third direction against a resilient member such as the third spring 230-3. The movement of the second magnet 220 in the third direction toward the third spring 230-3 changes the alignment of the second magnet 220 with the first magnet 216.

While FIGS. 2-1 and 2-2, as well as FIGS. 3-1 and 3-2, describe the adjustment mechanisms as being the same in the first direction, second direction, and third direction, any combination of adjustment mechanisms may be used to adjust the position and/or orientation of the second magnet relative to the housing and/or first magnet. Similarly, any combination or types of resilient members may be positioned opposite the adjustment mechanisms. For example, while the first spring 230-1 is illustrated as a leaf spring in FIG. 3-1 and the second spring 230-2 is illustrated as a coil spring, the first spring 230-1 may be a coil spring compressed against a cover, and the second spring 230-2 may be a leaf spring.

Figure 41:
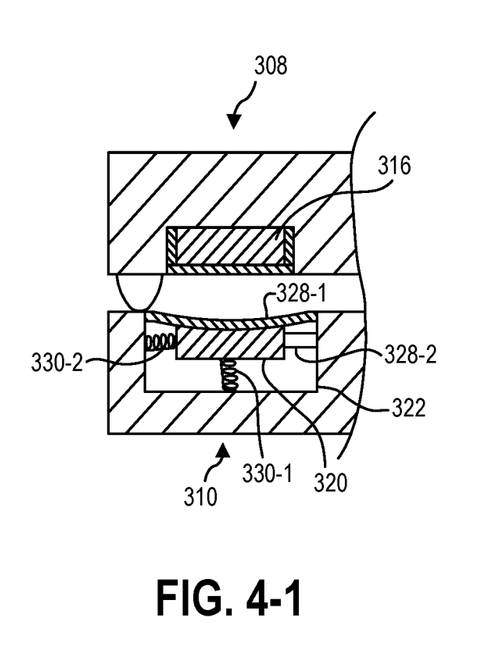

FIG. 4-1 is a side cross-sectional view of yet another implementation of a closure device according to the present disclosure. The closure device may use a combination of adjustment mechanisms. The first closure portion 308 includes a first magnet 316 and the second closure portion 310 includes a second magnet 320. The second magnet 320 is movable by a plurality of adjustment mechanisms relative to a housing 322 of the second magnet 320. For example, the first adjustment mechanism 328-1 is one or more shims that are positioned adjacent the second magnet 320 to move the second magnet 320 relative to a top end of the housing 322. A first spring 330-1 urges the second magnet 320 in the first direction against the shim of the first adjustment mechanism 328-1, while a second adjustment mechanism 328-2 displaces the second magnet 320 in the second direction against a second spring 330-2. The second adjustment mechanism 328-2 may be a rotatable cam to move the second magnet 320 in the second direction.

Figure 42:
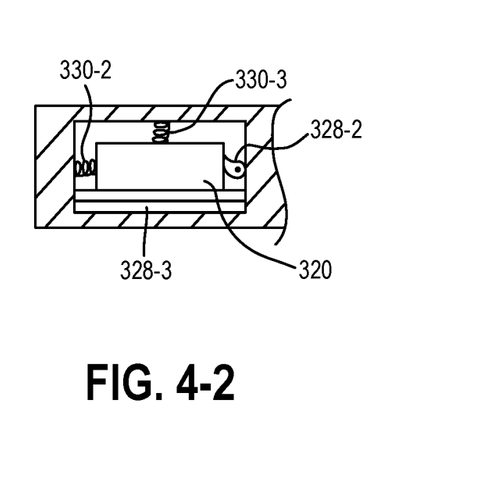

FIG. 4-2 is a top view of the second magnet 320 underneath the first adjustment mechanism. A third adjustment mechanism 328-3 is positioned orthogonal to the second adjustment mechanism 328-2 (and second spring 330-2) and the first adjustment mechanism (not visible in FIG. 4-2). The third adjustment mechanism 328-3 may be a plurality of shims that displaces the second magnet 320 in the third direction against a resilient member such as the third spring 330-3. The movement of the second magnet 320 in the third direction toward the third spring 330-3 changes the alignment of the second magnet 320 with the first magnet 316 shown in FIG. 4-1.

Figure 51:
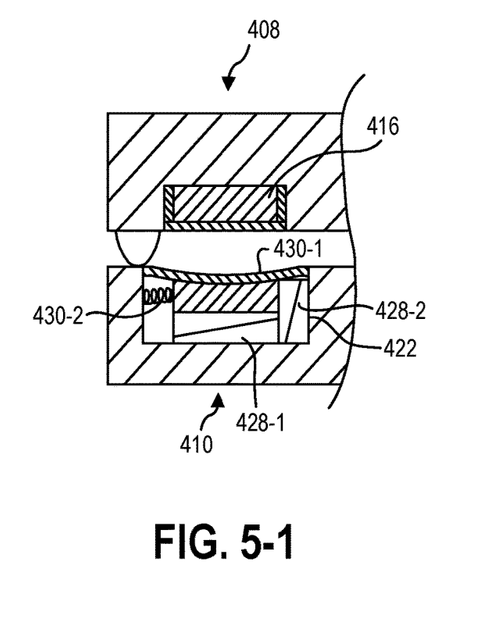

Other adjustment mechanisms may include wedges that displace along an angled surface when one wedge is moved relative to another. For example, FIG. 5-1 is a side cross-sectional view of yet another implementation of a closure device according to the present disclosure. The first closure portion 408 includes a first magnet 416 and the second closure portion 410 includes a second magnet 420. The second magnet 420 is movable by a plurality of adjustment mechanisms relative to a housing 422 of the second magnet 420. For example, the first adjustment mechanism 428-1 is a plurality of complementary wedges that are positioned adjacent the second magnet 420 to move the second magnet 420 relative to a top end of the housing 422. A first wedge may move in the second direction relative to a second wedge, which urges the first wedge against second magnet 420 in the first direction and against the first spring 430-1, while a second adjustment mechanism 428-2 displaces the second magnet 420 in the second direction against a second spring 430-2. The second adjustment mechanism 328-2 may be a second plurality of complementary wedges.

Figure 52:
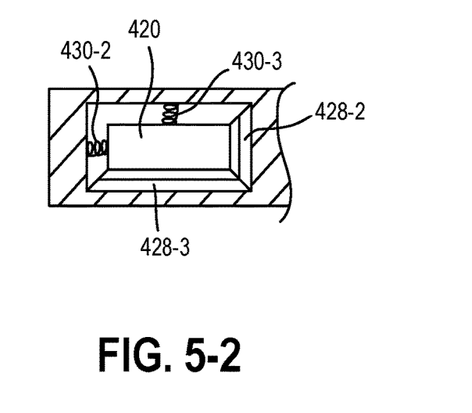

FIG. 5-2 is a top view of the second magnet 420 underneath the first spring. A third adjustment mechanism 428-3 is positioned orthogonal to the second adjustment mechanism 428-2 (and second spring 430-2) and the first adjustment mechanism (not visible in FIG. 5-2). The third adjustment mechanism 428-3 may be a plurality of complementary wedges that displaces the second magnet 420 in the third direction against a resilient member such as the third spring 430-3. The movement of the second magnet 420 in the third direction toward the third spring 430-3 changes the alignment of the second magnet 420 with the first magnet 416 shown in FIG. 5-1.

Figure 61:
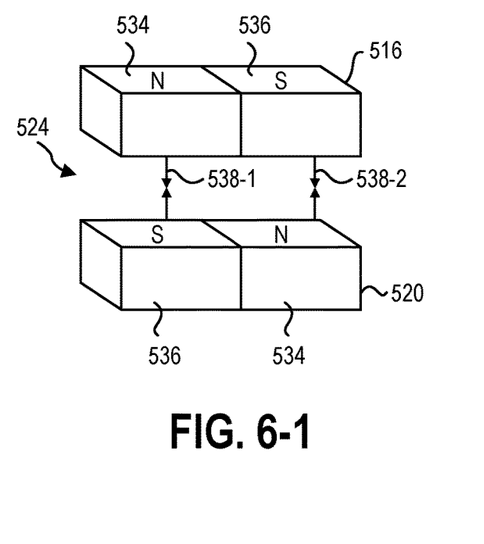

In some implementations, the first magnet and second magnet may have poles oriented in the second direction, such as illustrated in FIG. 6-1. A magnetic force 524 between the first magnet 516 and second magnet 520 may be an attraction force when a north pole 534 and south pole 536 of the first magnet 516 are aligned with the south pole 536 and north pole 534 of the second magnet 520, respectively. For example, the north pole 534 of the first magnet 516 and the south pole 536 of the second magnet 520 have a first attraction force 538-1 and the south pole 536 of the first magnet 516 and the north pole 534 of the second magnet 520 may have a second attraction force 538-2. When the first magnet 516 and second magnet 520 are positioned relative to one another with the north poles 534 and south poles 536, respectively, opposite one another, the attraction forces 538-1, 538-2 may be greatest in magnitude.

Figure 62:
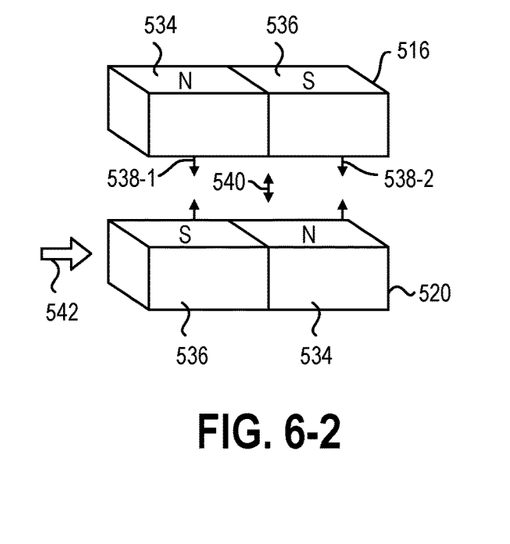

Altering the alignment of the north poles 534 and south poles 536 from that shown in FIG. 6-1 reduces the attraction forces 538-1, 538-2 and introduces a repulsion force 540, as shown in FIG. 6-2. As the second magnet 520 is displaced in the second direction 542 relative to the first magnet 516 (for example, by a second adjustment mechanism described herein), the total magnetic force (the sum of the attraction forces 538-1, 538-2 and repulsion forces 540) decreases.

The spacing between the first magnet and second magnet (e.g., the gap 126 described in relation to FIG. 2-1) and/or the alignment of the poles in the plane normal to the gap (e.g., as described in relation to FIG. 6-1) of the first magnet and second magnet changes the magnetic force between the magnets in the closed position. While the spacing and alignment have been described in relation to bar magnets in FIG. 2-1 through FIG. 6-2, other shapes of magnets may be used in a closure device according to the present disclosure.

Figure 71:
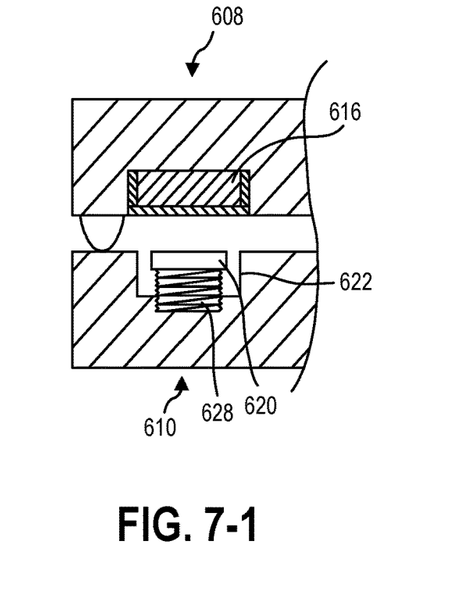
Figure 72:
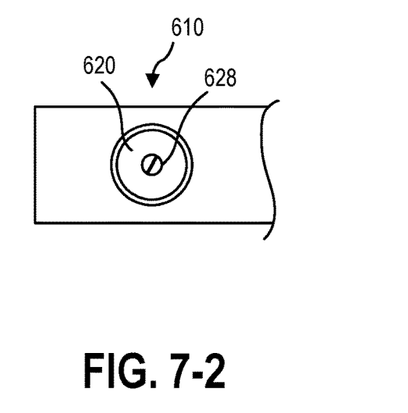

FIG. 7-1 is a side cross-sectional view of a closure device having a rotatable second magnet 620, according to at least one implementation of the present disclosure. The rotatable second magnet 620 is positioned in the second closure portion 610 opposite the first closure portion 608 that contains the first magnet 616. The second magnet 620 is fixed to a threaded, rotatable adjustment mechanism 628 that adjusts the position of the second magnet 620 in the first direction. The threaded, rotatable adjustment mechanism 628 engages with a complementarily threaded housing 622, such that rotation of the threaded, rotatable adjustment mechanism 628 relative to the housing 622 translates the second magnet 620 in the first direction relative to the housing 622. For example, FIG. 7-2 is a top view of the second closure portion 610, and the second magnet 620 may be annular magnet that allows access to a slotted interface (e.g., a slotted head) of the threaded, rotatable adjustment mechanism 628. The gap may be adjusted, therefore, by a flathead screwdriver.

Figure 81:
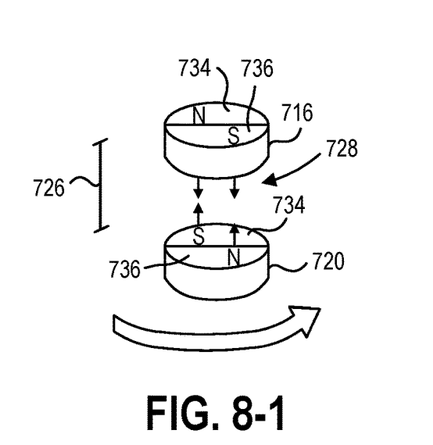
Figure 82:
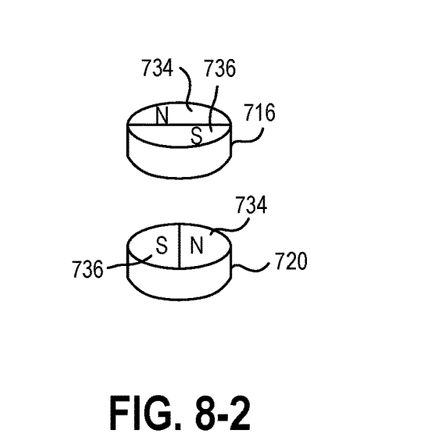
Figure 83:
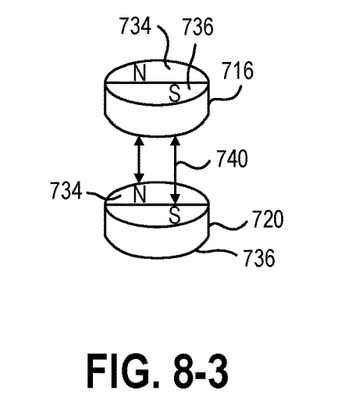

Additionally, some implementations of a rotatable second magnet may have a north pole and a south pole oriented in plane with a top surface of the magnet. FIG. 8-1 through 8-3 illustrate the rotation of a second magnet 720 relative to a first magnet 716 to alter the magnetic force therebetween at a constant gap 726. FIG. 8-1 illustrates the first magnet 716 and second magnet 720 rotationally oriented such that the north pole 734 and south pole 736 of first magnet 716 are rotationally aligned with the south pole 736 and north pole 734 of the second magnet 720, respectively. The rotation of the second magnet 720 adjusts the magnitude of the magnetic force 728 by altering the balance of the magnitude of an attraction force and a repulsion force.

FIG. 8-2 illustrates the second magnet 720 rotated relative to the first magnet 716 such that the north pole 734 and south pole 736 of first magnet 716 are not rotationally aligned with the south pole 736 and north pole 734 of the second magnet 720, respectively. The north pole 734 and south pole 736 of first magnet 716 are positioned at approximately a 90° relative to the orientation of the south pole 736 and north pole 734 of the second magnet 720. A 90° relative orientation of the north poles 734 and south poles 736 of the illustrated first magnet 716 and second magnet 720 produces approximately zero net magnetic force. In other words, there is no net attraction force or repulsion force between the first magnet 716 and second magnet 720.

FIG. 8-3 illustrates the first magnet 716 and second magnet 720 rotationally oriented such that the north pole 734 and south pole 736 of first magnet 716 are rotationally aligned with the north pole 734 and south pole 736 of the second magnet 720, respectively. Rotationally aligning the north poles 734 with one another and the south poles 736 with one another produces a repulsion force 740 that urges the first magnet 716 and second magnet 720 apart.

In some implementations, the rotational and/or lateral alignment (and/or misalignment) of the poles of the first magnet and second magnet may selectively provide both a net attraction force and a net repulsion force based on the positions of the magnets. For example, the closure device may provide an attraction force between the magnets to hold the first portion of the electronic device and the second portion in a closed position. The second magnet of the closure device may be selectively moved to a repulsion state, either by translation or by rotation relative to the first magnet, such that the closure device provides a repulsion force to assist in the movement of the first portion and second portion away from one another and toward an open position of the electronic device.

The adjustment mechanisms described herein may allow for the precise adjustment of the attraction force in the attraction state and/or the repulsion force in the repulsion state of the closure device. While the magnetic forces between the first closure portion and the second closure portion influence the opening and closing of the electronic device, additional forces and/or torques act upon the hinge during movement of the first portion relative to the second portion.

To accurately adjust the position and/or orientation of the second magnet relative to the first magnet, the net opening force may be measured in a variety of orientations. For example, the net opening force of the electronic device may be defined by the equation:

$$\tau_{Net} = \tau_B + \tau_F + \tau_M + \tau_g$$

Where $\tau_{Net}$ is the net torque required to move the first portion relative to the second portion, $\tau_B$ is the torque from the open biasing force of the hinge (such as the open biasing force 112 described in relation to FIG. 1), $\tau_F$ is the torque due to friction in the hinge, $\tau_g$ is the torque due the force of gravity on the first portion and/or second portion of the electronic device, and $\tau_M$ is the torque due to the magnets of the closure device.

The torque due to friction and the torque from the biasing force of the hinge are known for a given electronic device (such as a constant torque hinge through rotation, a progressive resistance hinge, or a hybrid of the two), the torque due to the force of gravity changes with the orientation of the electronic device, and the torque from the magnets can be adjusted to produce the desired net torque. To ensure the net torque on the hinge is within comfortable ranges for the user, the net torque is measured with the electronic device in different orientations.

In some implementations, the closed biasing force from the closure device that provides the $\tau_M$ is greater than the open biasing force from the hinge in the closed position. For example, the closed biasing force may be less than 10 N greater than the open biasing force. In other examples, the closed biasing force may be less than 20 N greater than the open biasing force. In yet other examples, the closed biasing force may be less than 50 N greater than the open biasing force.

Figure 9:
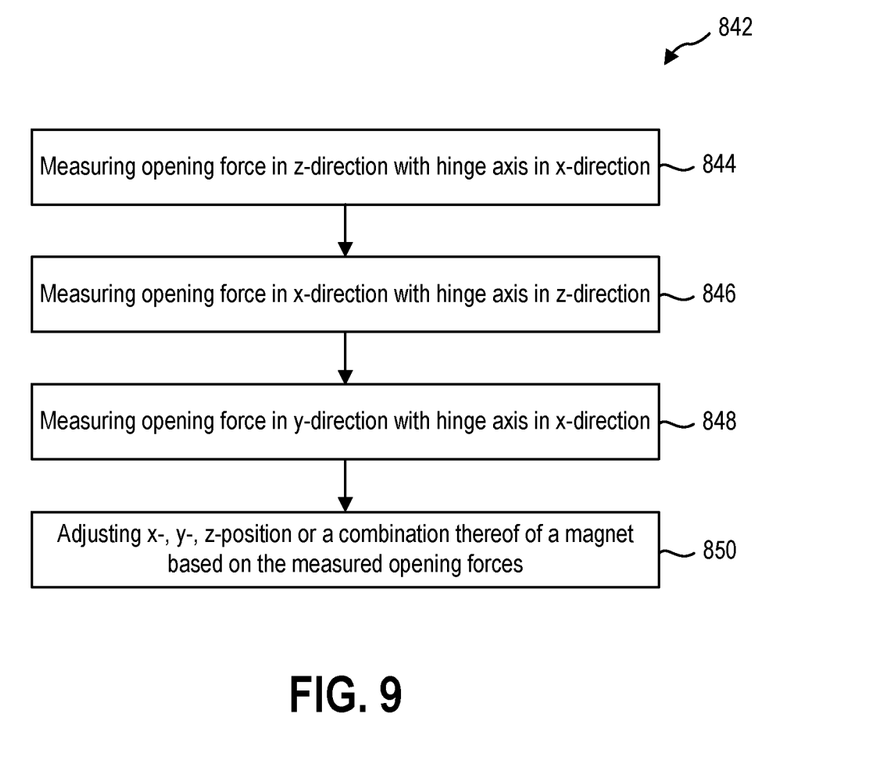
FIG. 9 is a flowchart illustrating a method of manufacturing a closure device, according to at least one implementation of the present disclosure.

FIG. 9 is a flowchart illustrating a method 842 of manufacturing a hinged electronic device. The method 842 includes measuring a net opening force in the z-direction with the hinge axis oriented in the x-direction at 844, measuring a net opening force in the x-direction with the hinge axis oriented in the z-direction at 846, measuring a net opening force in the y-direction with the hinge axis oriented in the x-direction at 848, and adjusting the position and/or orientation of a magnet of the closure device based on the measured net opening forces at 850.

Figure 10:
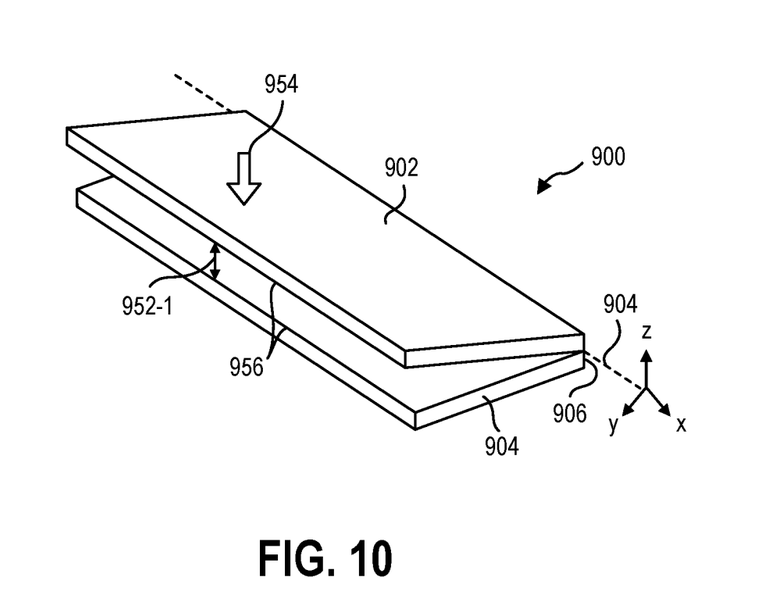
FIG. 10 is a schematic representation of measuring a z-direction net opening force of a hinged electronic device, according to at least one implementation of the present disclosure.
Figure 11:
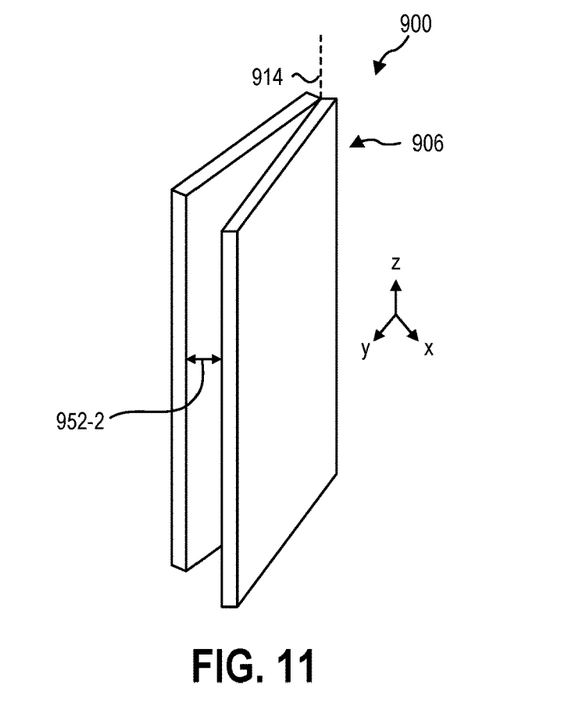
FIG. 11 is a schematic representation of measuring a x-direction net opening force of the hinged electronic device of FIG. 10, according to at least one implementation of the present disclosure.
Figure 12:
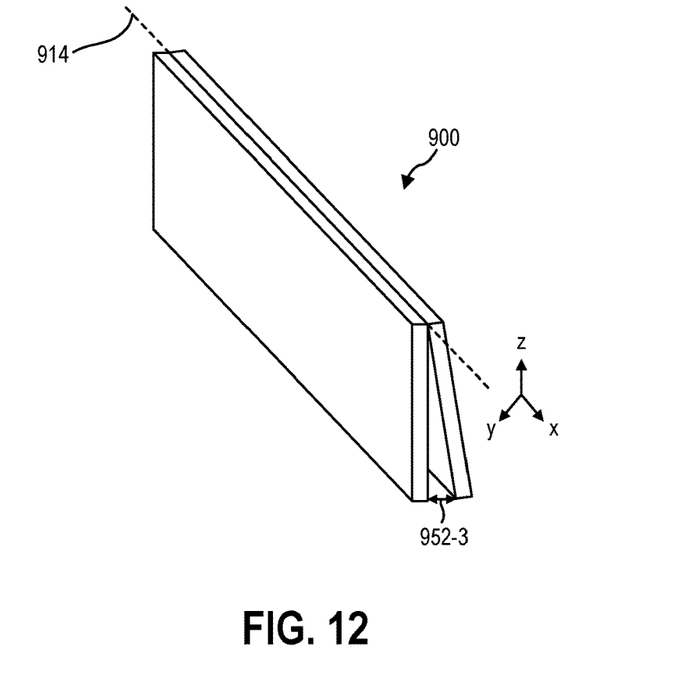
FIG. 12 is a schematic representation of measuring a y-direction net opening force of the hinged electronic device of FIG. 10, according to at least one implementation of the present disclosure.

FIG. 10 through FIG. 12 illustrate examples of the orientations of the electronic device 900 during measurement of the net opening force on the hinge 906 according to some implementations of the method 842 of FIG. 9. FIG. 10 is a perspective view of the electronic device 900 oriented with the hinge axis 914 in the x-direction. The first portion 902 and second portion 904 are positioned such that the z-direction net opening force 952-1 applied to open the electronic device 900 from the closed position toward the open position is oriented in the z-direction. The z-direction net opening force 952-1 may be the force needed to overcome the attraction force of the closure device, a force of gravity 954 of the first portion 902, and the friction of the hinge 906 with the assistance of the biasing force of the hinge 906.

In some implementations, the z-direction net opening force 952-1 may be at least 4.48 Newtons (N). In other words, the electronic device 900 may remain in the closed position until at least 4.48 N of force is applied at the edge 956 of the first portion 902 and second portion 904. In other implementations, the z-direction net opening force 952-1 is greater than 9.9 N. In yet other implementations, the z-direction net opening force 952-1 may be greater than 20 N. In further implementations, the z-direction net opening force 952-1 may be greater than 50 N.

FIG. 11 illustrates the electronic device 900 with the hinge axis 914 oriented in the z-direction. A x-direction net opening force 952-2 may be measured by opening the electronic device 900 from the closed position to the open position when the force of gravity is in the direction of the hinge axis 914, such that gravity does not apply a torque to the hinge 906. Without the force of gravity acting against the opening force, the x-direction net opening force 952-2 (with the hinge axis 914 in the z-direction) is greater than the z-direction net opening force 952-1 measured in FIG. 10.

In some implementations, the x-direction net opening force 952-2 may be at least 4.48 Newtons (N). In other implementations, the x-direction net opening force 952-2 is greater than 9.9 N. In yet other implementations, the x-direction net opening force 952-2 may be greater than 20 N. In further implementations, the x-direction net opening force 952-2 may be greater than 50 N.

FIG. 12 illustrates the electronic device 900 with the hinge axis 914 oriented in the x-direction. A y-direction net opening force 952-3 may be measured by opening the electronic device 900 from the closed position to the open position when the force of gravity is perpendicular to the direction of the hinge axis 914 and the direction of the opening force. Gravity applies little to no force in such an orientation, until the first portion 902 and/or the second portion 904 move away from the closed position toward the open position. Without the force of gravity acting against the opening force, the y-direction net opening force 952-3 is greater than the z-direction net opening force 952-1 measured in FIG. 10.

In some implementations, the y-direction net opening force 952-3 may be at least 4.48 Newtons (N). In other implementations, the y-direction net opening force 952-3 is greater than 9.9 N. In yet other implementations, the y-direction net opening force 952-3 may be greater than 20 N. In further implementations, the y-direction net opening force 952-3 may be greater than 50 N.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one implementation" or "an implementation" of the present disclosure are not intended to be interpreted as excluding the existence of additional implementations that also incorporate the recited features. For example, any element described in relation to an implementation herein may be combinable with any element of any other implementation described herein. Numbers, percentages, ratios, or other values stated herein are intended to include that value, and also other values that are "about" or "approximately" the stated value, as would be appreciated by one of ordinary skill in the art encompassed by implementations of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to implementations disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. For example, claim 1 recites "an adjustment mechanism" and claim 9 recites "an adjustment mechanism means." The "adjustment mechanism" of claim 1 is not intended to invoke means-plus-function or other functional claiming, while the "adjustment mechanism means" of claim 9 is intended to invoke means-plus-function or other functional claiming. Corresponding structure for the "adjustment mechanism means" of claim 9 may be found throughout the specification, but at least in the various implementations of the "adjustment mechanisms" of FIGS. 2-1 through 5-2 and 7-1 through 8-3. Each addition, deletion, and modification to the implementations that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described implementations are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A closure device, the closure device comprising:
    a first magnet configured to be positioned in a first object; and
    a housing configured to be positioned in a second object, the housing including:
        a top end,
        a second magnet positioned in the housing, and
        at least one adjustment mechanism connected to the housing that is configured to move the second magnet to adjust a gap between the first magnet and the second magnet to alter a magnetic force between the first magnet and the second magnet when the first magnet is positioned proximate the top end of the housing;
    a spring opposite the adjustment mechanism to apply a force to the second magnet toward the adjustment mechanism.

2. The closure device of claim 1, the at least one adjustment mechanism including a screw configured to translate the second magnet relative to the housing.

3. The closure device of claim 1, the at least one adjustment mechanism including a cam configured to translate the second magnet relative to the housing.

4. The closure device of claim 1, the at least one adjustment mechanism including a shim configured to translate the second magnet relative to the housing.

5. The closure device of claim 1, the at least one adjustment mechanism including a rotational axis configured to rotate a pole of the second magnet relative to the housing.

6. The closure device of claim 1, the at least one adjustment mechanism including a wedge and configured to translate the second magnet relative to the housing.

7. The closure device of claim 1, the at least one adjustment mechanism including a threaded carrier fixedly attached to the second magnet and configured to translate the second magnet relative to the housing as a portion of the threaded carrier is rotated.

8. A method of manufacturing the closure device of claim 1, the method comprising:
    measuring a z-direction net opening force in a z-direction applied to a hinge of an electronic device from a closed position toward an open position with a hinge axis of the hinge oriented in a x-direction orthogonal to the z-direction where the z-direction is a direction of gravity;
    measuring a x-direction net opening force in the x-direction applied to the hinge of the electronic device from the closed position toward the open position with the hinge axis of the hinge oriented in the z-direction orthogonal to the x-direction;
    measuring a y-direction net opening force in a y-direction applied to the hinge of the electronic device from the closed position toward the open position with the hinge axis of the hinge oriented in the x-direction orthogonal to the y-direction; and
    adjusting an x-position, a y-position, or a z-position of a magnet of the closure device of claim 1 based on the x-direction net opening force, the y-direction net opening force, or the z-direction net opening force.

9. The method of claim 8, adjusting an x-position, a y-position, or a z-position of the first magnet of the closure device of claim 1 such that the z-direction net opening force is greater than 5 Newtons (N).

10. An electronic device, the electronic device comprising:
    a first portion;
    a second portion movably connected to the first portion;
    a hinge connecting the first portion to the second portion, the hinge having a closed position and an open position;
    an open biasing element configured to bias the hinge toward the open position; and
    a closure device configured to bias the hinge toward the closed position, the closure device including:
        a first magnet positioned in the first portion, and
        a housing positioned in the second portion, the housing including:
            a top end,
            a second magnet positioned in the housing,
            at least one adjustment mechanism means for altering a magnetic force between the first magnet and the second magnet when the first magnet is positioned proximate the top end of the housing by moving the first magnet or the second magnet in a first direction relative to the top end of the housing and by moving the first magnet or the second magnet in a second direction relative to the top end of the housing, and a spring opposite the adjustment mechanism to apply a force to the second magnet toward the adjustment mechanism.

11. The electronic device of claim 10, the closure device providing less than 10 N of force greater than the open biasing element in the closed position.

12. The electronic device of claim 10, the open biasing element providing greater force than the closure device when the hinge is more than 10° from the closed position.

13. The electronic device of claim 10, the open biasing element being a spring in the hinge.

14. The electronic device of claim 10, the closure device including a magnet having a north pole and south pole in a plane of the top end of the housing.

15. The electronic device of claim 10, the closure device having an attraction state and a repulsion state, the closure device being actuatable between the attraction state and the repulsion state, the closure device biasing the electronic device toward the open position when in the repulsion state.

16. The electronic device of claim 10, the hinge having a rotational friction, and the open biasing element generates an open biasing force toward the open position that is less than a total of the closed biasing force and the rotational friction when the electronic device is in the closed position.

17. The electronic device of claim 16, a repulsion force of the closure device combined with the opening force of the open biasing element being greater than the rotational friction.

18. The electronic device of claim 17, the repulsion force of the closure device in the repulsion state combined with the opening force of the open biasing element being greater than the rotational friction combined with a force of gravity on the first portion or second portion.

19. A closure device, the closure device comprising:
a first magnet configured to be positioned in a first object; and
a housing configured to be positioned in a second object, the housing including:
a top end,
a second magnet positioned in the housing,
at least one adjustment mechanism connected to the housing that is configured to move the second magnet simultaneously in at least two directions relative to the top end of the housing to alter a magnetic force between the first magnet and the second magnet when the first magnet is positioned proximate the top end of the housing, and
a spring opposite the adjustment mechanism to apply a force to the second magnet toward the adjustment mechanism.

* * * * *